United States Patent
Choi

(10) Patent No.: US 8,163,623 B2
(45) Date of Patent: Apr. 24, 2012

(54) USING A MESH TO FORM A LOWER ELECTRODE IN A CAPACITOR

(75) Inventor: Jong Hun Choi, Icheon (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 12/981,408

(22) Filed: Dec. 29, 2010

(65) Prior Publication Data

US 2011/0165751 A1    Jul. 7, 2011

(30) Foreign Application Priority Data

Jan. 4, 2010 (KR) .................. 10-2010-0000078

(51) Int. Cl.
*H01L 21/20* (2006.01)
*H01L 21/469* (2006.01)

(52) U.S. Cl. ......... 438/396; 257/E21.011; 257/E21.014; 438/791

(58) Field of Classification Search .......... 438/396–399, 438/791; 257/E21.011, E21.014, E21.018, 257/E21.019, E21.02

See application file for complete search history.

(56) References Cited

U.S. PATENT DOCUMENTS

| | | | |
|---|---|---|---|
| 2004/0171210 A1* | 9/2004 | Shimamoto et al. | 438/240 |
| 2006/0258111 A1* | 11/2006 | Jagueneau et al. | 438/396 |
| 2008/0023745 A1* | 1/2008 | Lee et al. | 257/305 |
| 2009/0111061 A1* | 4/2009 | Chau et al. | 430/323 |

FOREIGN PATENT DOCUMENTS

| | | |
|---|---|---|
| KR | 101998060608 A | 10/1998 |
| KR | 1020050062915 A | 6/2005 |

\* cited by examiner

*Primary Examiner* — Kevin Parendo

(57) ABSTRACT

A method of manufacturing a semiconductor device which previously form sidewalls between lower electrodes to prevent bunkers and leaning phenomena during a sacrificial layer dip out process, thereby improving characteristic of the device, is provided. The method includes forming a mesh pattern defining a storage node region over a semiconductor substrate, forming a lower electrode over the semiconductor substrate and sidewalls of the mesh pattern, forming a dielectric layer over the semiconductor substrate including the lower electrode, and forming an upper electrode over the dielectric layer.

12 Claims, 5 Drawing Sheets

(i)

(ii)

USING A MESH TO FORM A LOWER ELECTRODE IN A CAPACITOR

CROSS-REFERENCES TO RELATED APPLICATION

The present application claims priority to Korean patent application number 10-2010-0000078, filed on 4 Jan. 2010, which is incorporated by reference in its entirety.

BACKGROUND OF THE INVENTION

The present invention relates to a method of manufacturing a semiconductor device, and more particularly, to a method of forming a capacitor.

Recently, as integration of semiconductor devices has become high in recent years, cell size has been reduced so that it is difficult to form a capacitor having sufficient capacitance. Particularly, in dynamic random access memories (DRAMs) which include unit cells constituting of one MOS transistor and one capacitor, reduction in dimension becomes an important factor in high integration along with increased capacitance of the capacitor which uses a large chip area.

As described above, the capacitor includes a lower electrode, an upper electrode and a dielectric layer disposed there between. In order to increase the capacitance of the capacitor, it must form the dielectric layer of a high dielectric material, reduce the thickness of the dielectric layer or increase a surface area of the electrode.

According to this, a cylinder structure in the capacitor being capable of providing a larger surface area has been suggested.

The cylinder structure is formed by forming a hole in which an electrode of a capacitor is to be formed in an insulating layer, forming a lower electrode of the capacitor within the hole, removing the insulating layer which is used as a sacrificial layer, and sequentially depositing a dielectric layer and an upper electrode along a surface of the lower electrode. Accordingly, the cylinder structure can use both inner and outer surfaces of the lower electrode as an effective surface of the capacitor so that it is possible to form the capacitor having a larger capacitance in a given area than a concave structure.

SUMMARY

According to one aspect of an exemplary embodiment, a method of manufacturing a semiconductor device, comprising: forming a mesh pattern defining a storage node region over a semiconductor substrate; forming a lower electrode over the semiconductor substrate and sidewalls of the mesh pattern; forming a dielectric layer over the lower electrode; and forming an upper electrode over the dielectric layer.

The lower electrode, the dielectric layer and the upper electrode defines a capacitor.

The mesh pattern includes a silicon nitride layer.

The forming a mesh pattern includes: forming a sacrificial layer over the semiconductor substrate; forming a mesh mask pattern over the sacrificial layer; etching the sacrificial layer using the mesh mask pattern as an etching mask to form mesh trench in the a sacrificial layer; removing the mesh mask pattern; forming a silicon nitride layer in the mesh trench; performing a planarization until the sacrificial layer is exposed; and removing the sacrificial layer.

The forming a mesh pattern includes: forming a silicon nitride layer over the semiconductor substrate; forming a mesh mask pattern over the silicon nitride layer; etching the silicon nitride layer using the mesh mask pattern as an etching mask; and removing the mask pattern.

The forming a mesh pattern includes; forming a first line pattern; and forming a second line pattern passing across the first line pattern to obtain the mesh pattern.

The forming a first line patterns includes: forming a first sacrificial line pattern over the semiconductor substrate; forming a silicon nitride layer over a sidewall of the first sacrificial line pattern; and removing the first sacrificial line pattern.

The forming a second line pattern includes: forming a second sacrificial line pattern passing across the first line pattern; forming a silicon nitride layer over sidewalls of the second sacrificial line pattern; and removing the sacrificial line pattern.

The forming a first line pattern includes: forming a silicon nitride layer over the semiconductor substrate; forming a mask pattern over the silicon nitride layer; etching the silicon nitride layer using the mask pattern as an etching mask; and removing the mask pattern.

The forming a second line pattern includes: forming a sacrificial layer over the semiconductor substrate including the first line pattern; forming a line mask pattern passing across the first line pattern over the sacrificial layer; etching the sacrificial layer using the line mask pattern and the first line pattern as an etching mask to form a sacrificial layer pattern; removing the mask pattern; forming a silicon nitride layer over sidewalls of the sacrificial layer pattern; and removing the sacrificial layer pattern.

The forming a lower electrode includes: forming a lower electrode material covering a plurality of the mesh patterns; and etching the lower electrode material in such a manner that lower electrodes over neighboring mesh patterns are separated from each other.

The lower electrode material includes any one selected from the group consisting of titanium nitride (TiN), tantalum nitride (TaN), tungsten nitride (WN), rubidium (Ru), platinum (Pt), iridium (Ir), and a combination thereof.

The dielectric layer includes any one selected from the group consisting of aluminum oxide ($Al_2O_3$), zirconium oxide ($ZrO_2$), hafnium oxide ($HfO_2$), tantalum oxide ($Ta_2O_5$), titanium oxide ($TiO_2$), $BaTiO_3$ (BTO), $BaSrTiO_3$ (BST), and a combination thereof.

The upper electrode include a polysilicon layer.

According to one aspect of an exemplary embodiment, a method for forming a capacitor for a semiconductor device, the method comprising: forming a mesh pattern over a semiconductor substrate; forming a lower electrode over the semiconductor substrate and sidewalls of the mesh pattern; forming a dielectric layer over the lower electrode; and forming an upper electrode over the dielectric layer, wherein the lower electrode, the dielectric layer and the upper electrode defines the capacitor.

The mesh pattern includes a silicon nitride layer.

The forming a mesh pattern includes: forming a sacrificial layer over the semiconductor substrate; forming a mesh mask pattern over the sacrificial layer; etching the sacrificial layer using the mesh mask pattern as an etching mask to form a mesh trench in the a sacrificial layer; removing the mesh mask pattern; forming a silicon nitride layer in the mesh trench; and removing the second sacrificial layer.

These and other features, aspects, and embodiments are described below in the section entitled "DESCRIPTION OF EXEMPLARY EMBODIMENT".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1A:
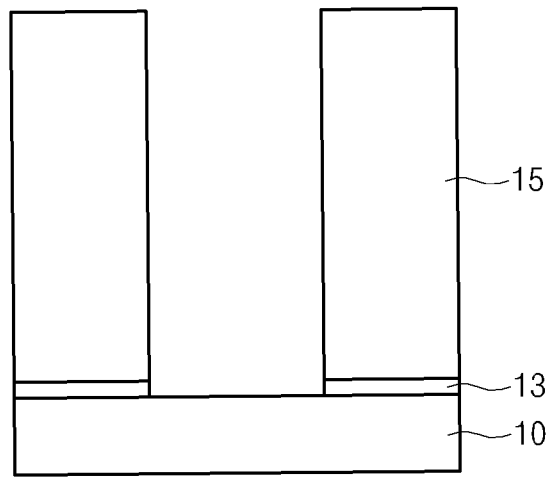
FIGS. 1A to 1D are cross-sectional views illustrating a general method of manufacturing a semiconductor device including a cylinder type capacitor.

Embodiments of the present invention are described herein with reference to cross-sectional illustrations that are schematic illustrations of the embodiments (and intermediate structures). As such, variations from the shapes of the illustrations, for example, of manufacturing techniques and/or tolerances, are to be expected. Thus, the embodiments of the present invention should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly over the other or substrate, or intervening layers may also be present.

A general method of manufacturing a semiconductor device including a cylinder type capacitor will be described as follows.

Referring to FIG. 1A, an etching stop layer (not shown) and a sacrificial oxide layer (not shown) are formed over a semiconductor substrate 10 including a storage node contact (not shown).

Next, the sacrificial oxide layer and the etching stop layer are etched to form a sacrificial oxide layer pattern 15 and an etching stop layer pattern 13 to expose the storage node contact.

Figure 1B:
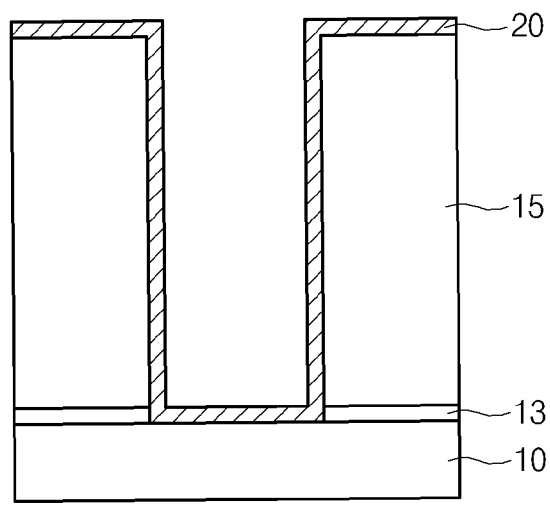
Figure 1C:
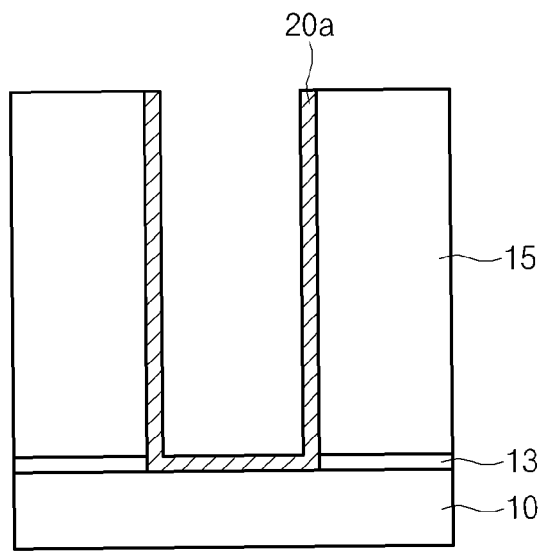

Referring to FIGS. 1B and 1C, a lower electrode material 20 is deposited over the whole of the semiconductor substrate 10 including the sacrificial oxide layer pattern 15. Herein, the lower electrode material 20 may include a titanium (Ti) layer, a titanium nitride (TiN) layer, or both.

Next, a planarization process is performed until the sacrificial oxide layer pattern 15 is exposed to separate the lower electrode material 20 between cells, thereby forming a lower electrode 20a.

Figure 1D:
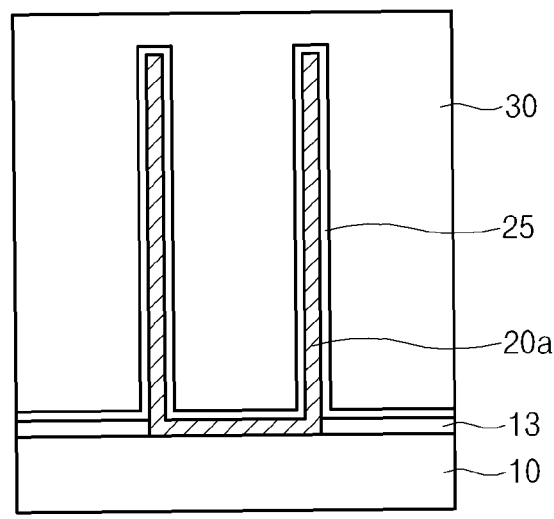

Referring to FIG. 1D, a full dip out process is performed to remove the sacrificial oxide layer pattern 15. When the full dip out process is performed, a bunker may occur due to minute cracks in the etching stop layer pattern 13. Due to this, a leaning phenomena where the lower electrode is collapsed is caused.

Next, a dielectric layer 25 and an upper electrode 30 are formed over a surface of the semiconductor substrate 10 including the lower electrode 20a.

In order to increase capacitance in the above cylinder type capacitor, a height of the lower electrode needs to be increased. However, if the height of the lower electrode is increased, a leaning phenomena where the lower electrode is collapsed is caused when an insulating layer between the cylinder type electrodes is removed. Accordingly, characteristic and reliability of the device are degraded.

Hereinafter, a method of manufacturing a semiconductor device according to an embodiment of the inventive concept will be described in further detail with reference to the accompanying drawings.

FIGS. 2A to 2F are plan views and cross-sectional views illustrating a method of manufacturing a semiconductor device according to an embodiment of the present invention. In FIGS. 2A to 2F, (i) is a plan view and (ii) is a cross-sectional view taken along the line X-X' of (i).

Figure 2A:
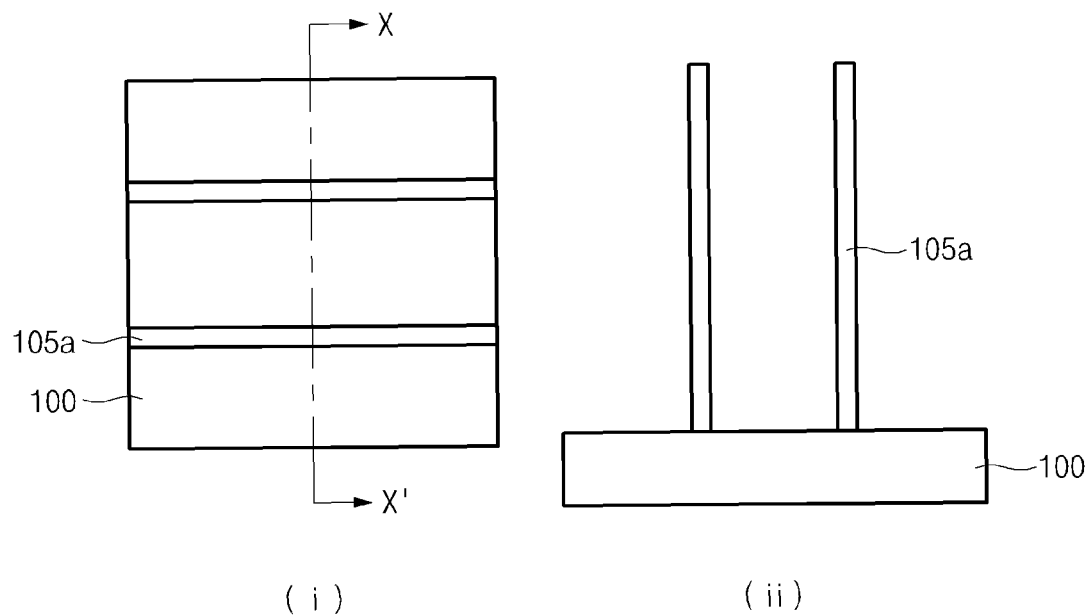
FIGS. 2A to 2F are plan views and cross-sectional views illustrating a method of a semiconductor device according to an embodiment of the inventive concept.

Referring to FIG. 2A, a plurality of line pattern 105a are formed over a semiconductor substrate 100 in which an underlying structure including storage node contacts (not shown) is included. The first line patterns 105a are formed along a first direction. There may be two methods of forming the first line patterns 105a. First, a silicon nitride layer is formed over the semiconductor substrate 100 and a mask pattern in which line patterns are defined is formed over the silicon nitride layer. Next, the silicon nitride layer is etched by using the mask pattern as an etching mask to form the first line patterns 105a.

Alternatively, a sacrificial layer is formed over the semiconductor substrate 100 and a mask pattern in which line patterns are defined is formed over the sacrificial layer. Then, the sacrificial layer is etched using the mask pattern as an etching mask to form a first trench and a silicon nitride layer is formed over inner walls of the first trench. Next, the sacrificial layer is removed to form the first line patterns 105a. Herein, the first line patterns 105a are extended in one direction so that a supporting axis is formed longer than a cylinder type pattern. Accordingly, when a process for removing the sacrificial layer is performed, the leaning is not easily caused.

Herein, the first line patterns 105a are used for defining storage node regions and a line width of a lower electrode in a subsequent process. The line width of the lower electrode is defined by a distance between two neighboring first line patterns 105a.

Figure 2B:
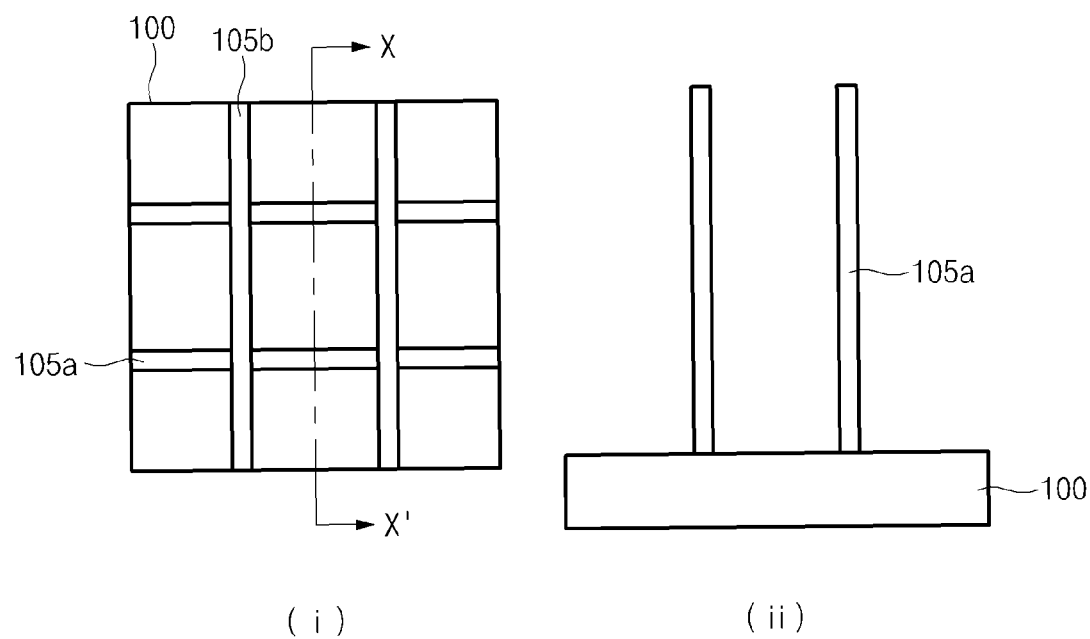

Referring to FIG. 2B, a plurality of second line patterns 105b are formed over the semiconductor substrate 100 to be passing across the first line patterns 105a. Accordingly, the first line patterns 105a and the second line patterns 105b are arranged in a mesh pattern. A line with and a height of the second line pattern 105b may be the same as those of the first line patterns 105a. The second line patterns 105b are formed by the following method. First, a sacrificial layer is formed over the semiconductor substrate 100 over which the first line patterns 105 are formed. Then, a mask pattern in which line patterns are defined is formed over the sacrificial layer. Then, the sacrificial layer is etched by using the mask pattern and the first line pattern 115a as an etching mask to form a second trench. Then, a silicon nitride layer is formed over inner sidewalls of the second trench. Next, the sacrificial layer is removed to form the second line patterns 105b.

The above first and second line patterns 105a and 105b serve as sidewalls between the lower electrodes and define the storage node regions. Accordingly, the storage node contacts (not shown) are exposed below the first and second line patterns 105a and 105b.

Herein, the method for forming the first and second line patterns 105a and 105b is not limited to a method which forms the first line patterns 105a and then forms the second line patterns 105b crossed with the first line patterns 105a as illustrated in FIGS. 2A and 2B. For example, the first line patterns 105a and the second line patterns 105b are formed by one process by using a mask pattern in which a mesh pattern is defined.

First, a silicon nitride layer is formed over the semiconductor substrate 100 and a mesh mask pattern is formed over the silicon nitride layer. Next, the silicon nitride layer is etched using by the mesh mask pattern as an etching mask to form a mesh pattern including the first patterns 105 and the second patterns 105b. Alternatively, a sacrificial layer is formed over the semiconductor substrate 100 and a mesh mask pattern is formed over the sacrificial layer. Next, the sacrificial layer is etched using the mesh mask pattern as an etching mask to form a trench. Then, a silicon nitride layer is formed over the inner walls of the trench. Next, the sacrificial layer is removed to form a mesh pattern formed of the first line patterns 105a and the second line patterns 105b.

Figure 2C:
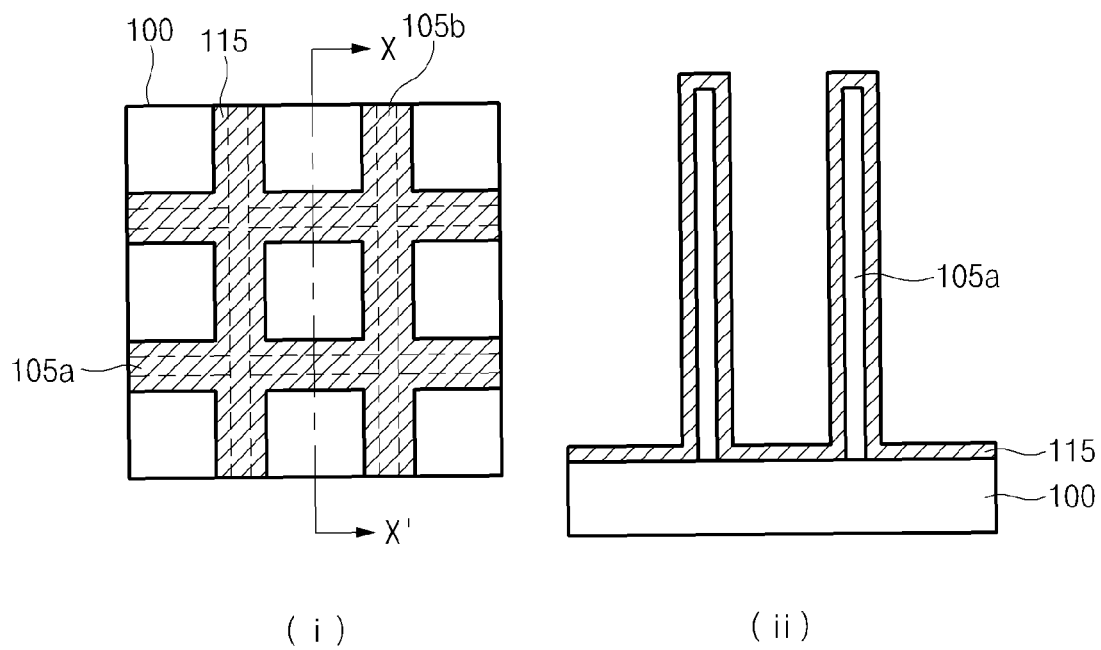
Figure 2D:
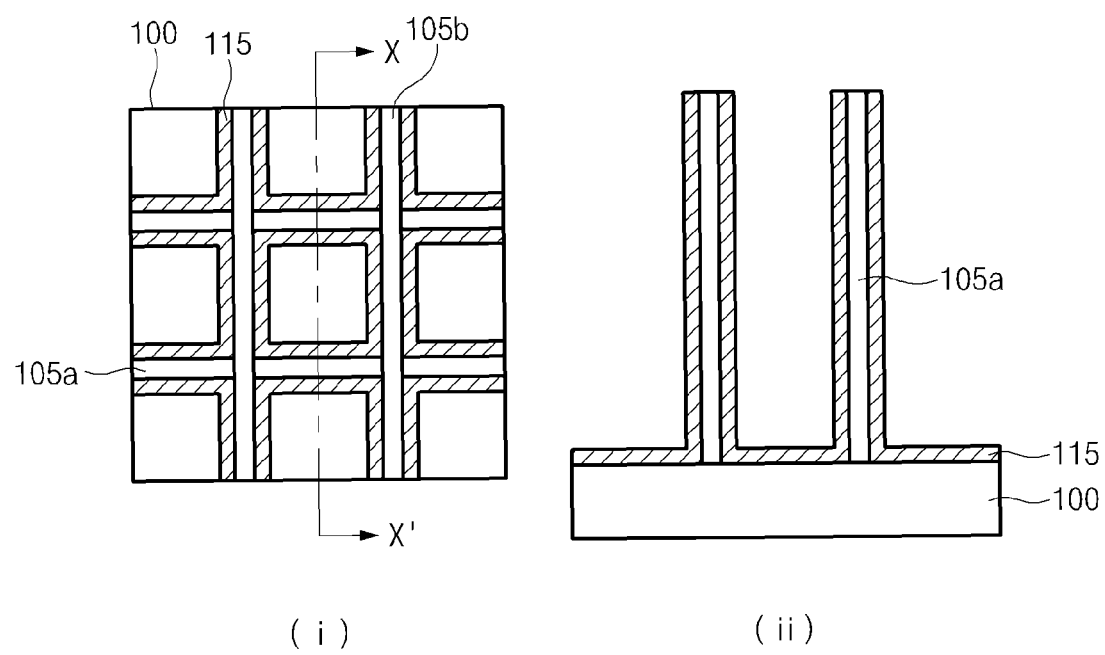

Referring to FIGS. 2C and 2D, a lower electrode material 115 is deposited over the first and second line patterns 105a and 105b. Herein, the lower electrode material 115 may include a metal nitride layer such as titanium nitride (TiN), tantalum nitride (TaN), tungsten nitride (WN), or the like. The lower electrode material 115 may also be formed of a noble metal rubidium (Ru), platinum (Pt), iridium (Ir), or the like.

A planarization process is performed until the first and second line patterns 105a and 105b are exposed to form a lower electrode 105a separated between cells. Herein, the lower electrode 115a is formed to be connected to the storage node contact (not shown).

Figure 2E:
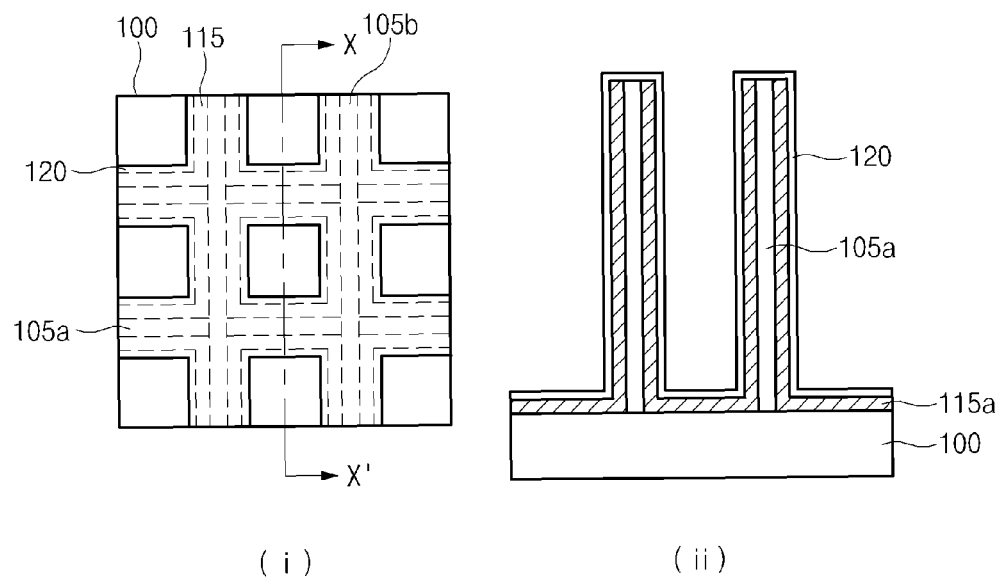
Figure 2F:
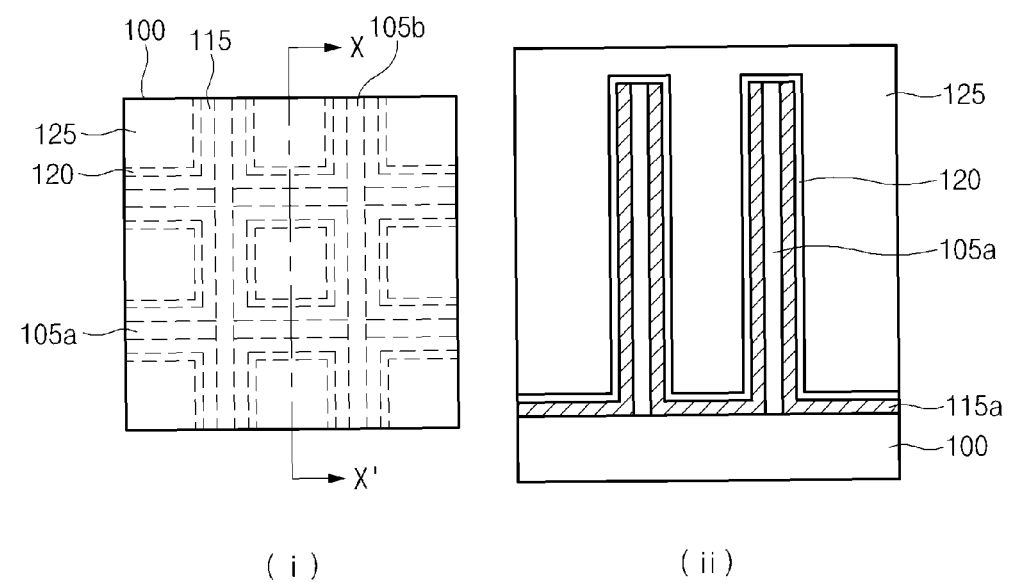

Referring to FIGS. 2E and 2F, a dielectric layer 120 is formed over the whole surface of the semiconductor substrate 100 including the first and second line patterns 105a and 105b. The dielectric layer 120 may include any of aluminum oxide ($Al_2O_3$), zirconium oxide ($ZrO_2$), hafnium oxide ($HfO_2$), tantalum oxide ($Ta_2O_5$), titanium oxide ($TiO_2$), $BaTiO_3$ (BTO), $BaSrTiO_3$ (BST) and a combination thereof.

Herein, a buffer layer (not shown) may be formed between the dielectric layer 120 and the lower electrode (115a). The buffer layer serves to improve an interface characteristic.

Next, an upper electrode 125 is formed over the whole of the semiconductor substrate 100 including the dielectric layer 120. Herein, the upper electrode 125 may include a polysilicon layer.

In a general cylinder type lower electrode, if a height of the lower electrode is increased, a leaning phenomena where the lower electrode is collapsed is caused during removal of an insulating layer between the lower electrodes so that characteristic and reliability of a device are degraded. However, as described above, a mesh insulating pattern serving as a framework for lower electrodes can prevent such bunker and leaning phenomena which is caused in a dip out process of a sacrificial layer.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A method of manufacturing a semiconductor device, comprising:
    forming a mesh pattern defining a storage node region over a semiconductor substrate;
    forming a lower electrode over the semiconductor substrate and sidewalls of the mesh pattern;
    forming a dielectric layer over the lower electrode; and
    forming an upper electrode over the dielectric layer,
    wherein the forming the mesh pattern includes:
        forming a first line pattern; and
        forming a second line pattern passing across the first line pattern to obtain the mesh pattern,
    wherein the forming the first line pattern includes:
        forming a first sacrificial line pattern over the semiconductor substrate;
        forming a first silicon nitride layer over a sidewall of the first sacrificial line pattern; and
        removing the first sacrificial line pattern, and
    wherein the forming the second line pattern includes:
        forming a second sacrificial line pattern passing across the first line pattern;
        forming a second silicon nitride layer over a sidewall of the second sacrificial line pattern; and
        removing the second sacrificial line pattern.

2. The method of claim 1, wherein the forming the lower electrode includes:
    forming a lower electrode material over a surface of the semiconductor substrate including the mesh pattern; and
    etching the lower electrode material until an upper surface of the mesh pattern is exposed.

3. The method of claim 2, wherein the lower electrode material includes any selected from the group consisting of titanium nitride (TiN), tantalum nitride (TaN), tungsten nitride (WN), rubidium (Ru), platinum (Pt), iridium (Ir), and a combination thereof.

4. The method of claim 1, wherein the dielectric layer includes any selected from the group consisting of aluminum oxide ($Al_2O_3$), zirconium oxide ($ZrO_2$), hafnium oxide ($HfO_2$), tantalum oxide ($Ta_2O_5$), titanium oxide ($TiO_2$), $BaTiO_3$ (BTO), $BaSrTiO_3$ (BST), and a combination thereof.

5. The method of claim 1, wherein the upper electrode includes a polysilicon layer.

6. The method of claim 1, wherein the lower electrode, the dielectric layer and the upper electrode together define a capacitor.

7. A method of manufacturing a semiconductor device, comprising:
    forming a mesh pattern defining a storage node region over a semiconductor substrate;
    forming a lower electrode over the semiconductor substrate and sidewalls of the mesh pattern;
    forming a dielectric layer over the lower electrode; and
    forming an upper electrode over the dielectric layer,
    wherein the forming the mesh pattern includes:
        forming a first line pattern; and
        forming a second line pattern passing across the first line pattern to obtain the mesh pattern,
    wherein the forming the first line pattern includes:
        forming a first silicon nitride layer over the semiconductor substrate;
        forming a mask pattern over the silicon nitride layer;
        etching the silicon nitride layer using the mask pattern as an etching mask; and
        removing the mask pattern, and
    wherein the forming the second line pattern includes:
        forming a sacrificial layer over the semiconductor substrate including the first line pattern;
        forming a line mask pattern passing across the first line pattern over the sacrificial layer;
        etching the sacrificial layer using the line mask pattern and the first line pattern as an etching mask to form a sacrificial layer pattern;
        removing the mask pattern;
        forming a second silicon nitride layer over sidewalls of the sacrificial layer pattern; and
        removing the sacrificial layer pattern.

8. The method of claim 7, wherein the forming the lower electrode includes:
    forming a lower electrode material over a surface of the semiconductor substrate including the mesh pattern; and
    etching the lower electrode material until an upper surface of the mesh pattern is exposed.

9. The method of claim 8, wherein the lower electrode material includes any one selected from the group consisting of titanium nitride (TiN), tantalum nitride (TaN), tungsten nitride (WN), rubidium (Ru), platinum (Pt), iridium (Ir), and a combination thereof.

10. The method of claim 7, wherein the dielectric layer includes any one selected from the group consisting of aluminum oxide ($Al_2O_3$), zirconium oxide ($ZrO_2$), hafnium oxide ($HfO_2$), tantalum oxide ($Ta_2O_5$), titanium oxide ($TiO_2$), $BaTiO_3$ (BTO), $BaSrTiO_3$ (BST), and a combination thereof.

11. The method of claim 7, wherein the upper electrode includes a polysilicon layer.

12. The method of claim 7, wherein the lower electrode, the dielectric layer and the upper electrode defines a capacitor.

* * * * *